(12) United States Patent
Jacob et al.

(10) Patent No.: US 9,293,587 B2
(45) Date of Patent: Mar. 22, 2016

(54) FORMING EMBEDDED SOURCE AND DRAIN REGIONS TO PREVENT BOTTOM LEAKAGE IN A DIELECTRICALLY ISOLATED FIN FIELD EFFECT TRANSISTOR (FINFET) DEVICE

(71) Applicant: GLOBALFOUNDRIES Inc., Grand Cayman (KY)

(72) Inventors: Ajey Poovannummoottil Jacob, Albany, NY (US); Murat K. Akarvardar, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 83 days.

(21) Appl. No.: 13/948,374

(22) Filed: Jul. 23, 2013

(65) Prior Publication Data

US 2015/0028348 A1    Jan. 29, 2015

(51) Int. Cl.
  *H01L 29/78* (2006.01)
  *H01L 29/66* (2006.01)
  *H01L 21/84* (2006.01)
  *H01L 27/12* (2006.01)

(52) U.S. Cl.
  CPC .......... *H01L 29/785* (2013.01); *H01L 21/845* (2013.01); *H01L 27/1211* (2013.01); *H01L 29/66795* (2013.01)

(58) Field of Classification Search
  CPC ................ H01L 27/11; H01L 27/1104; H01L 21/823807; H01L 29/6659; H01L 27/0207; H01L 29/66795; H01L 29/785; H01L 29/4238; H01L 29/0696; H01L 21/76224; H01L 21/2018; H01L 21/76294; H01L 21/845; H01L 27/1211

USPC ................ 438/207, 218, 222, 403, 429, 607; 257/368, 369, 351, 401, E51.005, 257/E29.027

See application file for complete search history.

(56) References Cited

U.S. PATENT DOCUMENTS

| | | | |
|---|---|---|---|
| 8,264,021 B2 | 9/2012 | Lai et al. | |
| 8,809,940 B2 | 8/2014 | Lin et al. | |
| 2011/0024804 A1* | 2/2011 | Chang et al. | 257/288 |
| 2011/0079829 A1* | 4/2011 | Lai et al. | 257/288 |
| 2013/0256759 A1 | 10/2013 | Vellianitis et al. | |
| 2013/0270652 A1 | 10/2013 | Liaw | |
| 2013/0277686 A1* | 10/2013 | Liu et al. | 257/77 |
| 2014/0061820 A1* | 3/2014 | Reznicek et al. | 257/401 |
| 2014/0239355 A1 | 8/2014 | Yin et al. | |
| 2014/0252489 A1 | 9/2014 | Yu et al. | |

* cited by examiner

*Primary Examiner* — Michelle Mandala
(74) *Attorney, Agent, or Firm* — Williams Morgan, P.C.

(57) ABSTRACT

Approaches for isolating source and drain regions in an integrated circuit (IC) device (e.g., a fin field effect transistor (finFET)) are provided. Specifically, the FinFET device comprises a gate structure formed over a finned substrate; an isolation oxide beneath an active fin channel of the gate structure; an embedded source and a drain (S/D) formed adjacent the gate structure and the isolation oxide; and an epitaxial (epi) bottom region of the embedded S/D, the epi bottom region counter doped to a polarity of the embedded S/D. The device further includes a set of implanted regions implanted beneath the epi bottom region, wherein the set of implanted regions may be doped and the epi bottom region undoped. In one approach, the embedded S/D comprises P++ doped Silicon Germanium (SiGe) for a p-channel metal-oxide-semiconductor field-effect transistor (PMOSFET) and N++ Silicon Nitride (SiN) for a n-channel metal-oxide-semiconductor field-effect transistor (NMOSFET).

20 Claims, 14 Drawing Sheets

FORMING EMBEDDED SOURCE AND DRAIN REGIONS TO PREVENT BOTTOM LEAKAGE IN A DIELECTRICALLY ISOLATED FIN FIELD EFFECT TRANSISTOR (FINFET) DEVICE

BACKGROUND

1. Technical Field

This invention relates generally to the field of semiconductors, and more particularly, to approaches used to form source/drain regions in a dielectrically isolated FinFET device.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FINFET is formed by the intersection of two shapes, i.e., a gate layer rectangle on a silicon island formed from the silicon surface layer. Each of these layers of shapes, also known as mask levels or layers, may be created or printed optically through well known photolithographic masking, developing and level definition, e.g., etching, implanting, deposition and etc.

Silicon based FinFETs have been successfully fabricated using conventional MOSFET technology. A typical FinFET is fabricated on a substrate with an overlying insulating layer with a thin 'fin' extending from the substrate, for example, etched into a silicon layer of the substrate. The channel of the FET is formed in this vertical fin. A gate is provided over the fin(s). A double gate is beneficial in that there is a gate on both sides of the channel allowing gate control of the channel from both sides. Further advantages of FinFETs include reducing the short channel effect and higher current flow. Other FinFET architectures may include three or more effective gates.

It is currently known that performance improvement in a bulk finFET can be increased by adding high mobility channel materials. Germanium based devices (e.g., Ge-FinFET) include a fin formed at least in part, of germanium (as opposed to a silicon fin). Typical Ge-FinFET fabrication includes patterning a germanium layer on a substrate to form a narrow Ge-fin. However, even high mobility channel materials like Ge have aggravated junction leakage if the device interface is not properly engineered. As shown by the prior art device 10 of FIG. 1, the bulk FinFET suffers from punch-through leakage along the fin channel, which significantly contributes to overall device leakage. Furthermore, prior art device 10 is highly susceptible to damage during punch-through implant, and suffers from carrier spill-out to the undoped fin channel, which lowers the carrier mobility. Accordingly, what is needed is a solution to at least one of these deficiencies.

SUMMARY

In general, approaches for forming embedded source and drain regions in a dielectrically isolated FinFET device are provided. Specifically, the FinFET device comprises a gate structure formed over a finned substrate; an isolation oxide beneath an active fin channel of the gate structure; an embedded source and a drain (S/D) formed adjacent the gate structure and the isolation oxide; and an epitaxial (epi) bottom region of the embedded S/D, the epi bottom region of the embedded S/D counter doped to a polarity of the embedded S/D. The device further includes a set of implanted regions beneath the epi bottom region of the embedded S/D, wherein the set of implanted regions may be doped and the epi bottom region of the embedded S/D undoped. In one approach, the S/D comprises P++ doped Silicon Germanium (SiGe) for a p-channel metal-oxide-semiconductor field-effect transistor (PMOSFET) and N++ Silicon carbon (SiC) for a n-channel metal-oxide-semiconductor field-effect transistor (NMOSFET).

One aspect of the present invention includes a device comprising: a gate structure formed over a finned substrate; an embedded source and a drain (S/D) adjacent the gate structure; and an epitaxial (epi) bottom region of the embedded S/D, the epi bottom region counter doped to a polarity of the embedded S/D.

Another aspect of the present invention includes a fin field effect transistor (FinFET) device having isolated source and drain regions, the FinFET device comprising: a gate structure formed over a finned substrate; an isolation oxide beneath an active fin channel of the gate structure; an embedded source and a drain (S/D) formed adjacent the gate structure and the isolation oxide; and an epitaxial (epi) bottom region of the embedded S/D, the epi bottom region counter doped to a polarity of the embedded S/D.

Another aspect of the present invention includes a method for forming embedded source and drain regions in a dielectrically isolated fin field effect transistor (FinFET) device, the method comprising: forming a gate structure over a finned substrate; providing an isolation oxide beneath an active fin channel of the gate structure; forming an embedded source and a drain (S/D) adjacent the gate structure and the isolation oxide; and forming an epitaxial (epi) bottom region of the embedded S/D, the epi bottom region counter doped to a polarity of the embedded S/D.

BRIEF DESCRIPTION OF THE DRAWINGS

These and other features of this invention will be more readily understood from the following detailed description of the various aspects of the invention taken in conjunction with the accompanying drawings in which.

Figure 1:
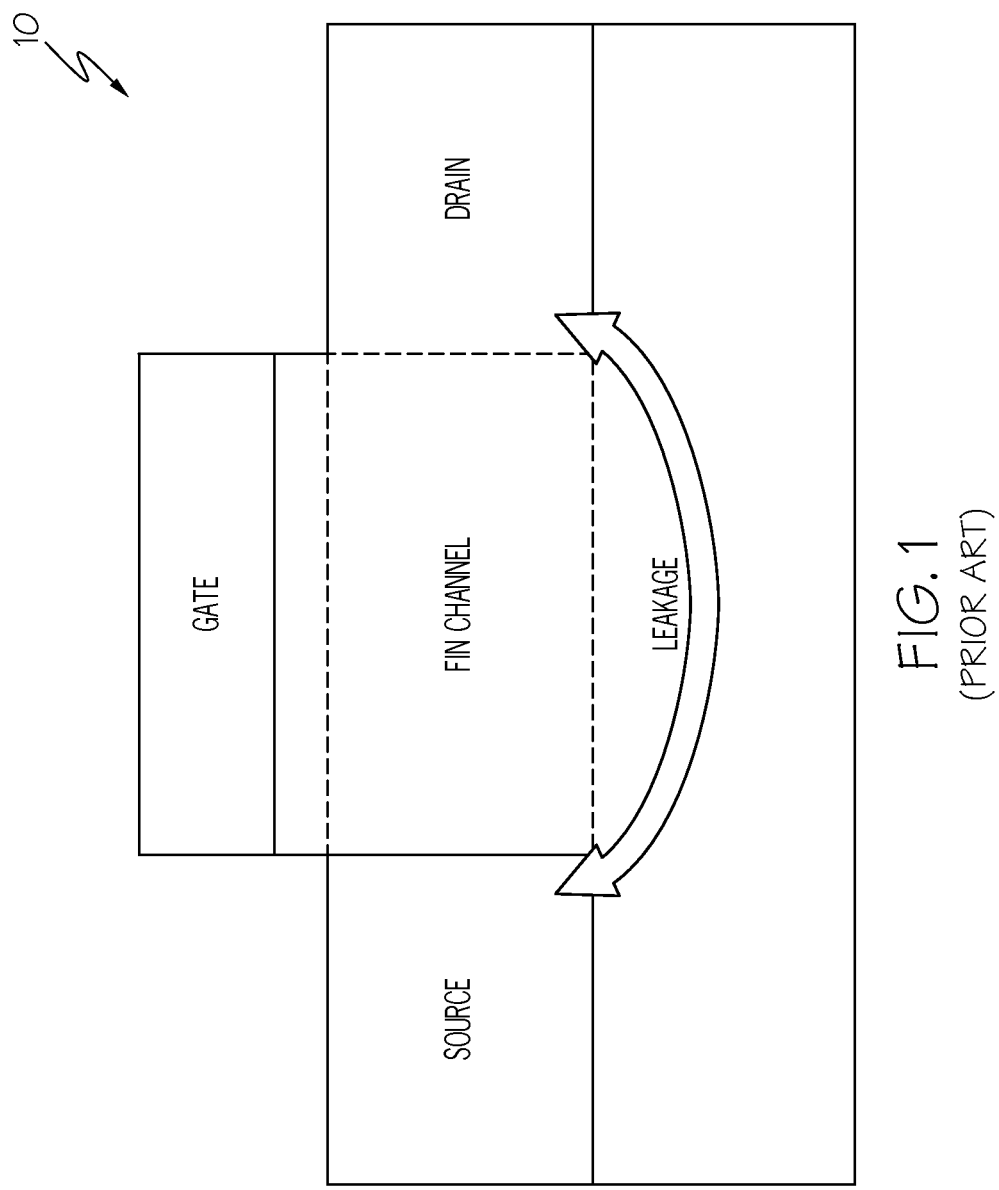
FIG. 1 shows a cross-sectional view of a prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for device isolation in a complementary metal-oxide finFET (e.g., a bulk finFET). Specifically, the FinFET device comprises a gate structure formed over a finned substrate; an isolation oxide beneath an active fin channel of the gate structure; an embedded source and a drain (S/D) formed adjacent the gate structure and the isolation oxide; and an epitaxial (epi) bottom region of the embedded S/D, the epi bottom region counter doped to a polarity of the embedded S/D. The device further includes a set of implanted regions implanted beneath the epi bottom region, wherein the set of implanted regions may be doped and the epi bottom region undoped.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

With reference again to the figures, FIG. 2(*a*) shows a cross sectional view of a device 200 according to an embodiment of the invention. Device 200 comprises a substrate 202 (e.g., bulk silicon) and a plurality of fins 204 patterned (e.g., etched) from substrate 202. Fins 204 may be fabricated using any suitable process including one or more photolithography and etch processes. The photolithography process may include forming a photoresist layer (not shown) overlying substrate 202 (e.g., on a silicon layer), exposing the resist to a pattern, performing post-exposure bake processes, and developing the resist to form a masking element including the resist. The masking element may then be used to etch fins 204 into the silicon layer, e.g., using reactive ion etch (RIE) and/or other suitable processes. In one embodiment, fins 204 are formed using a sidewall image transfer technique. In another embodiment, fins 204 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, but not limited to, double exposure (e.g., using two mask sets), forming spacers adjacent features and removing the features to provide a pattern of spacers, resist freezing, and/or other suitable processes.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

As also shown in FIG. 2(*a*), a silicon nitride (SiN) liner 206 is formed over device 200 and then removed from a top surface of substrate 202 in each channel region 208. Substrate 202 is then further etched, as shown in FIG. 2(*b*), exposing a bottom portion of each fin 204. This is followed by a shallow trench isolation (STI) material 212 deposition and planarization, as shown in FIG. 2(*c*), and a thermal oxidation (represented by arrows) to device 200, including the exposed bottom surfaces of each fin 204, as shown in FIG. 2(*d*). In this embodiment, each fin 204 below SiN liner 206 is exposed to oxygen, nitrous oxide, nitric oxide, or steam in a wet/dry environment at a temperature in the range of approximately 700 to 1000 degrees Celsius for the purposes of forming a thermal isolation oxide 214 beneath each fin 204, as shown in FIG. 2(*e*).

Next, as shown in FIG. 2(*f*), STI material 212 is recessed and SiN liner 206 is removed to expose and prepare each fin 204 for gate formation. A spacer 220 is then formed over each fin 204, as shown in the cross section along the gate of FIG. 2(g) (e.g., cross section along the short axis of the FIN (width of the FIN)), and the cross-section along the fins of FIG. 2(h) (e.g., cross section along the long axis of the FIN). A plurality of openings 222 are then formed through fins 204, STI material 212 and into substrate 202, as shown in FIG. 2(i). Openings 222 are patterned, for example, using a photo-lithography processes or other lithographic process (e.g., electron beam lithography, imprint lithography, etc.), and removed by a suitable etching process including a wet etch, dry etch, plasma etch, and the like.

Next, an epi material is deposited within openings 222 to form a set of epi bottom regions 224 of a S/D region in device 200. This is followed by formation of embedded SiGe source/drain(s) (S/D) 226 over epi bottom regions 224. In one approach, S/D 226 comprises P++ doped Silicon Germanium (SiGe) for a p-channel metal-oxide-semiconductor field-effect transistor (PMOSFET) and N++ Silicon carbon (SiC) for a n-channel metal-oxide-semiconductor field-effect transistor (NMOSFET). In this embodiment, epi bottom regions 224 are undoped, while S/Ds 226 are doped (e.g., with Boron). Here, the growth of undoped epi bottom regions 224 before formation of doped S/Ds 226 generates higher stress to channel region 208 while reducing the leakage (FIG. 2(a)).

Figure 2A:
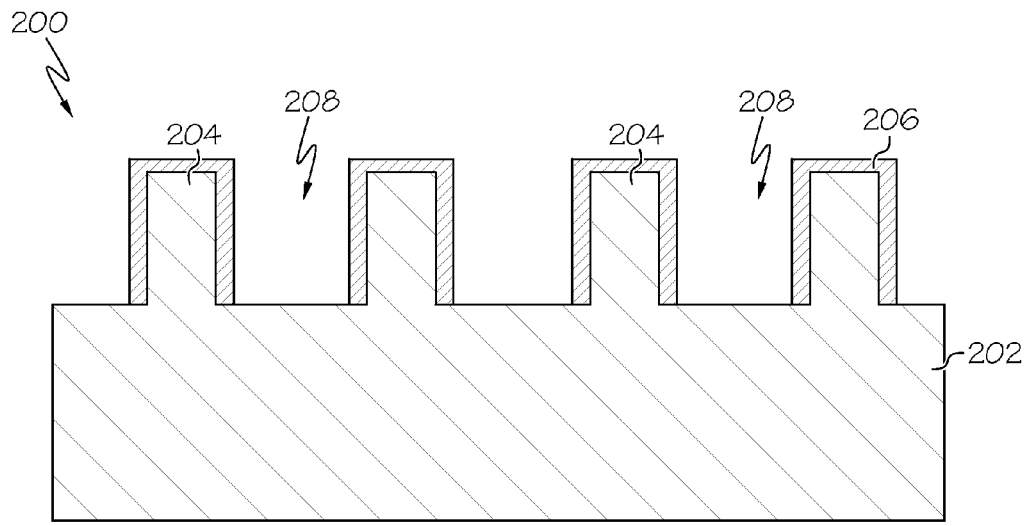
FIGS. 2(a)-2(l) show cross-sectional views of processing steps for isolating source and drain regions of an integrated circuit (IC) device according to an illustrative embodiment.
Figure 2B:
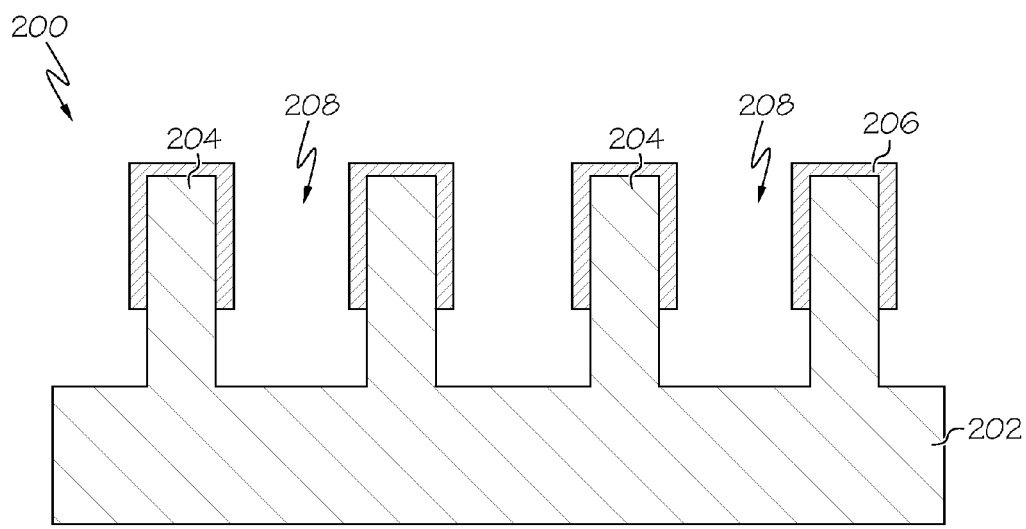
Figure 2C:
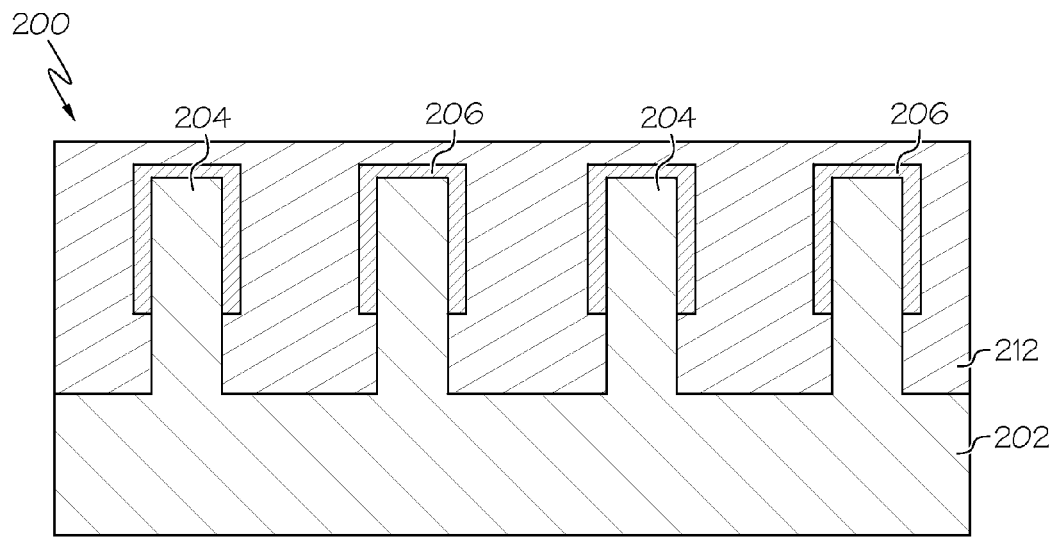
Figure 2D:
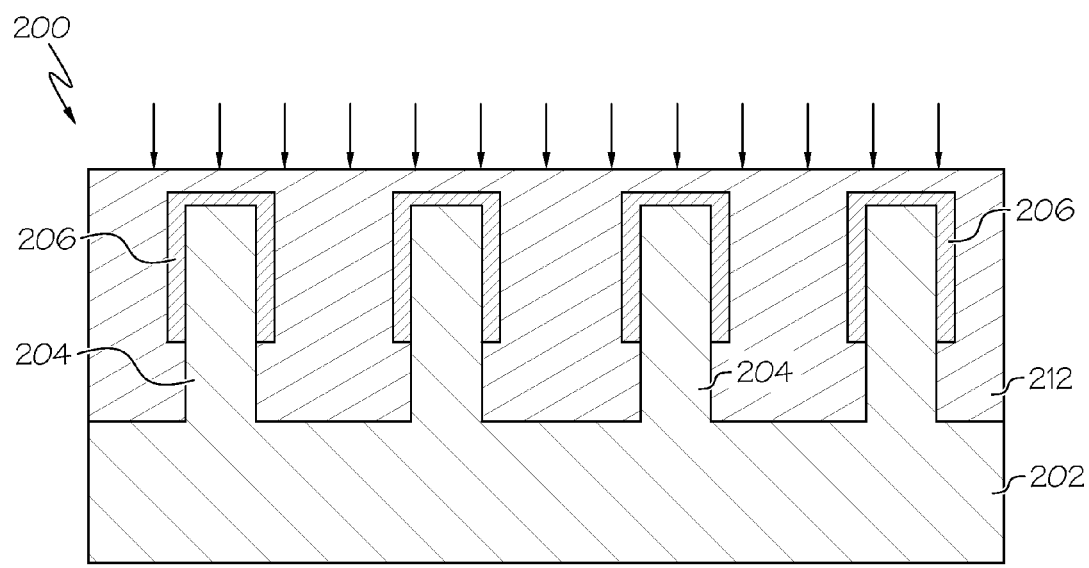
Figure 2E:
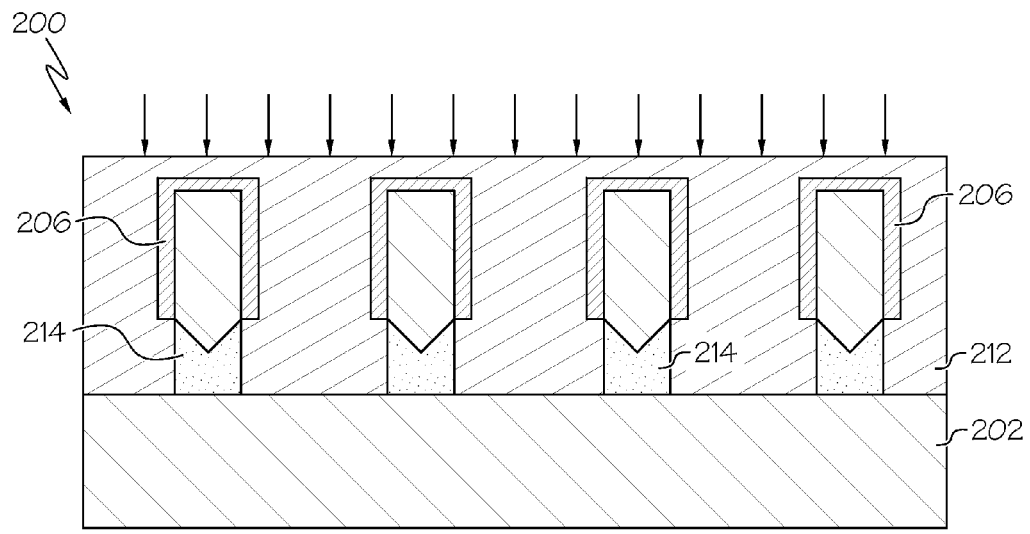
Figure 2F:
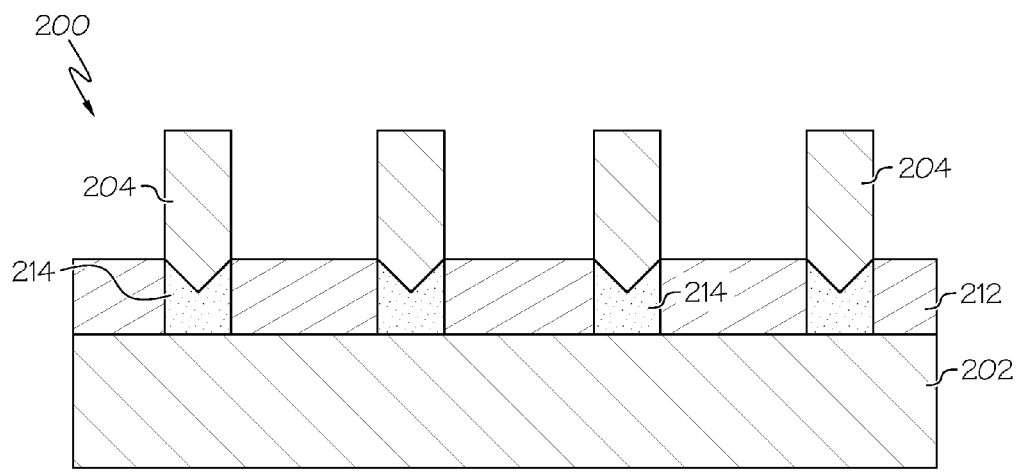
Figure 2G:
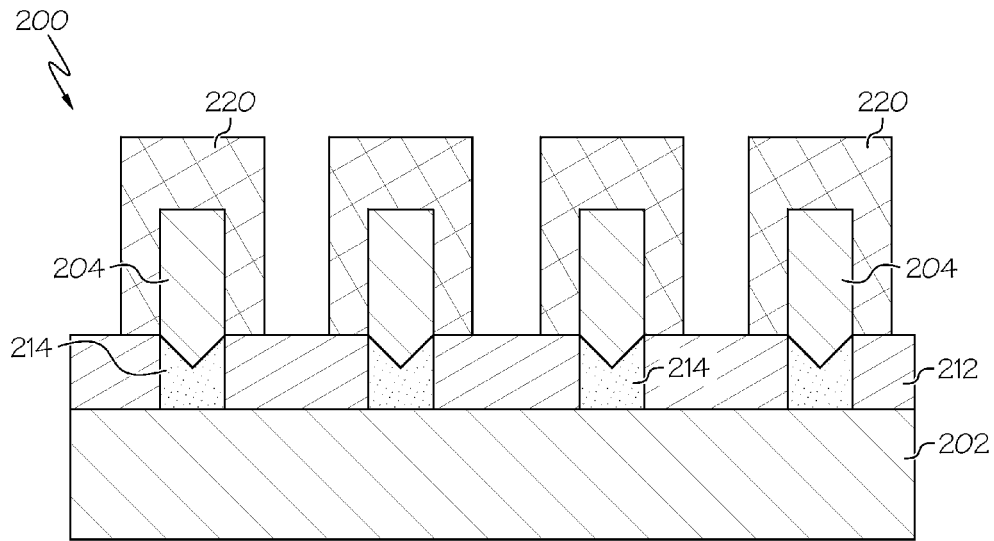
Figure 2H:
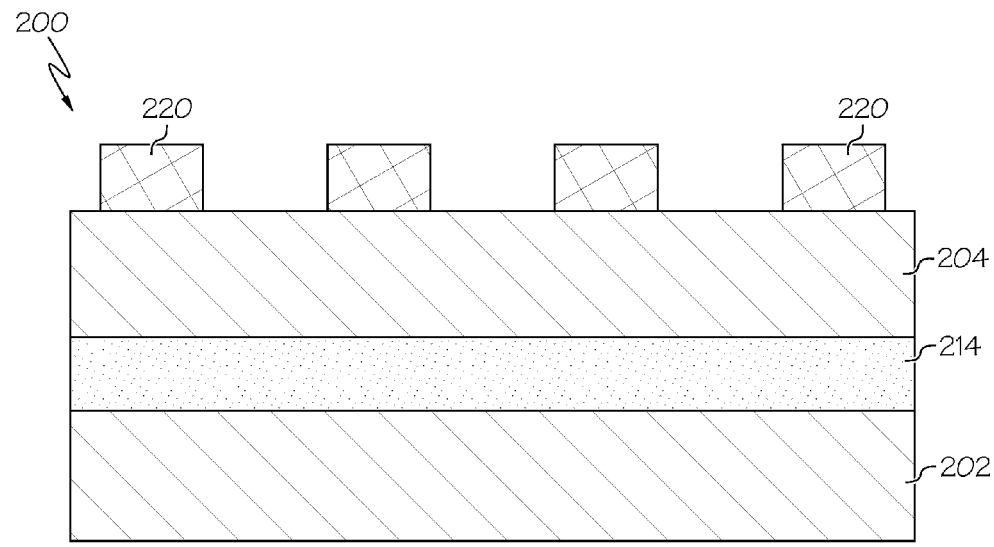
Figure 2I:
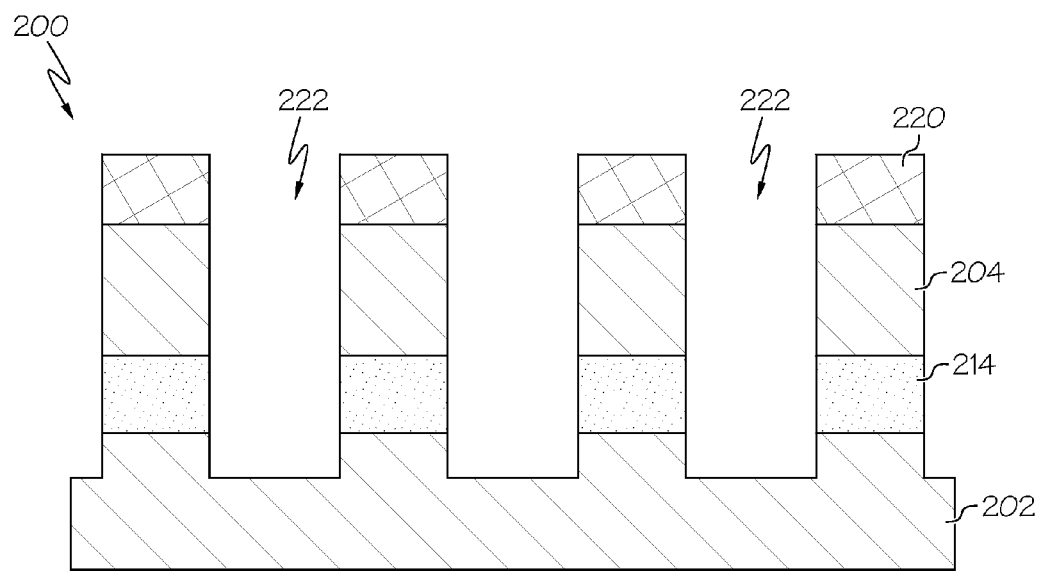
Figure 2J:
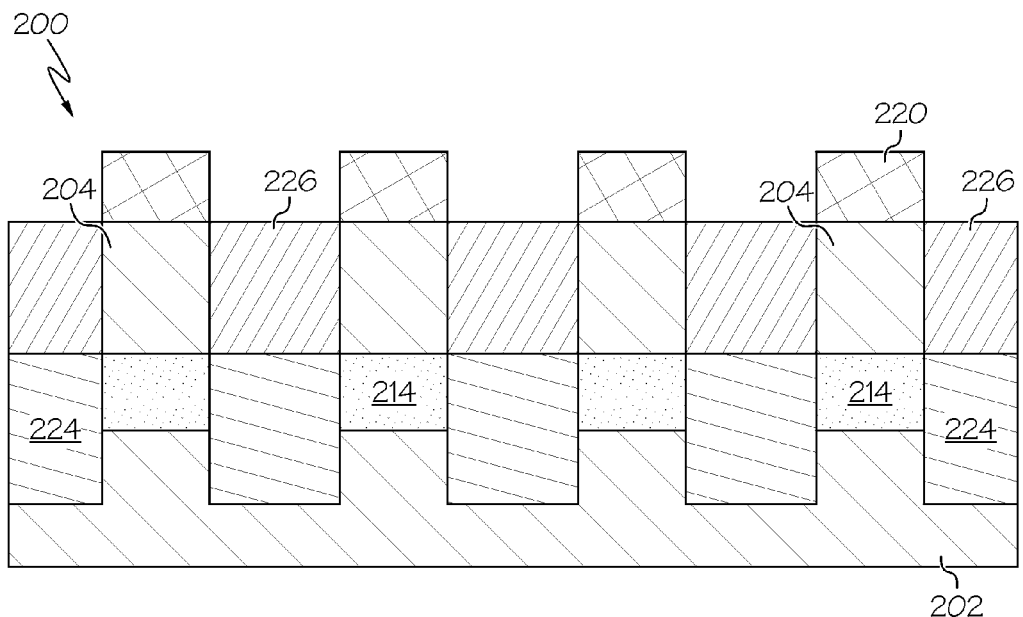
Figure 2K:
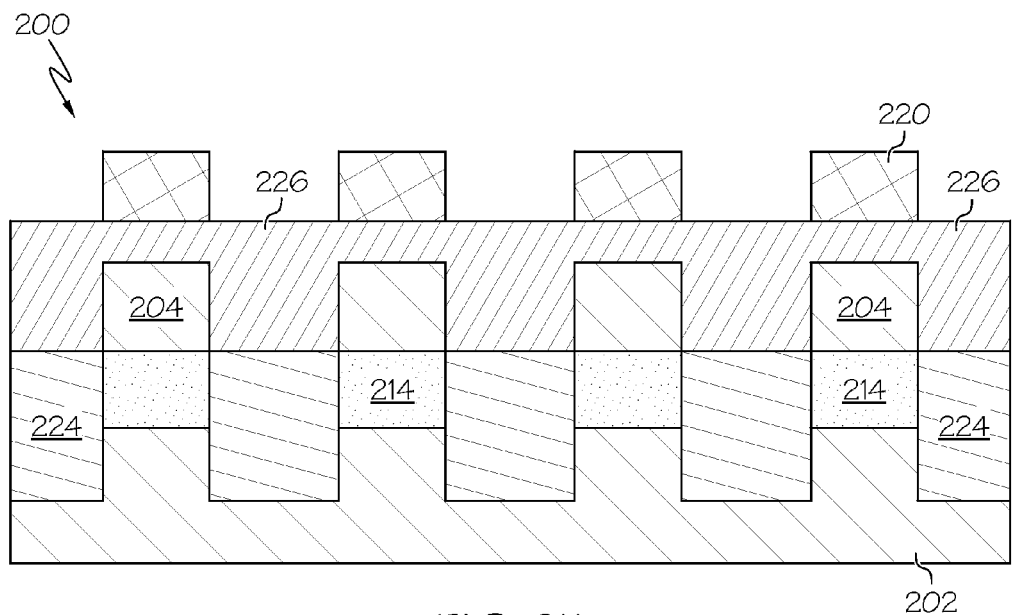

Next, as shown in FIG. 2(k), an optional EPI merge and polish may be performed. In this case, an epitaxial film of the material of S/D 226 (e.g., SiGe) is grown on each fin 204. As growth continues, each fin 204 becomes wider and wider until each individual fin grows together. Thus, the merged fins form one large epi-merged layer. In another embodiment, EPI material remains unmerged.

Figure 2L:
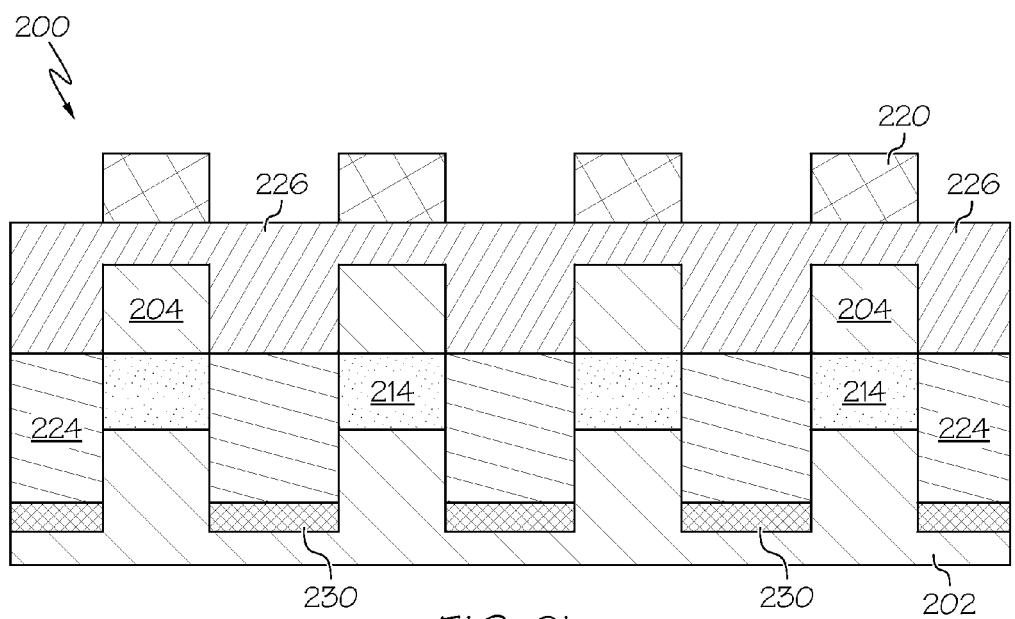

Next, as shown in FIG. 2(l), an implanted region 230 is formed in a bottom area of each epi bottom region 224. In this embodiment, epi bottom regions 224 are counter doped with silicon via ion implantation. For example, implanted region 230 may comprise N++ doped Si for PMOS or P++ Si for NMOS, formed by ion implantation and/or punch through implantation. Although not specifically shown, it will be appreciated that implanted regions 230 may be formed prior to epi deposition in an alternative embodiment. In this case, the implantation is done on to the silicon substrate at the embedded S/D region of epi.

Figure 3A:
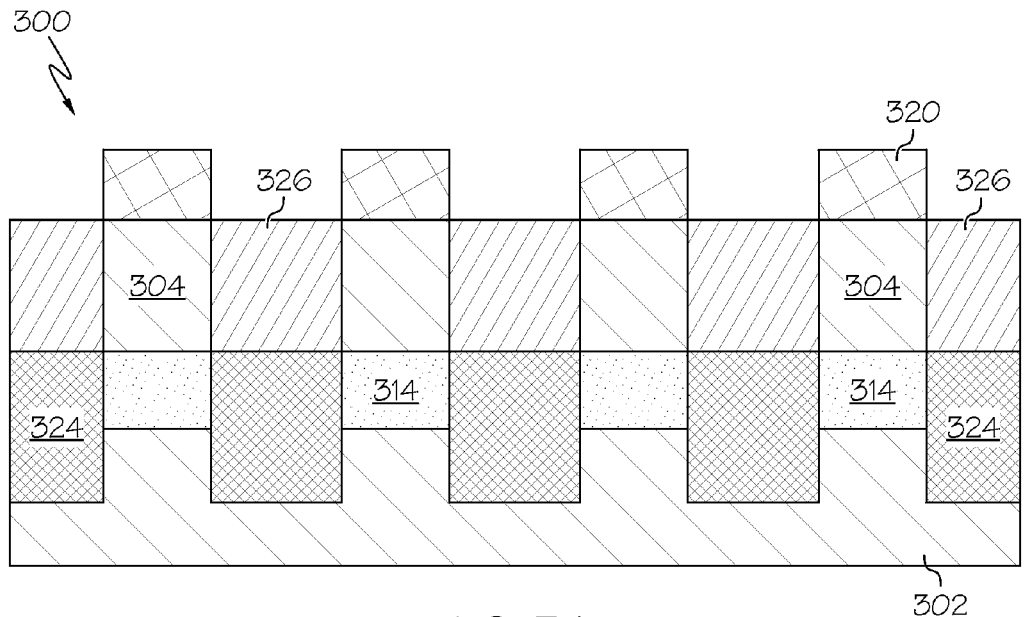
FIGS. 3(a)-3(b) show a cross-sectional view of processing steps for isolating source and drain regions of an integrated circuit (IC) device according to another illustrative embodiment.
Figure 3B:
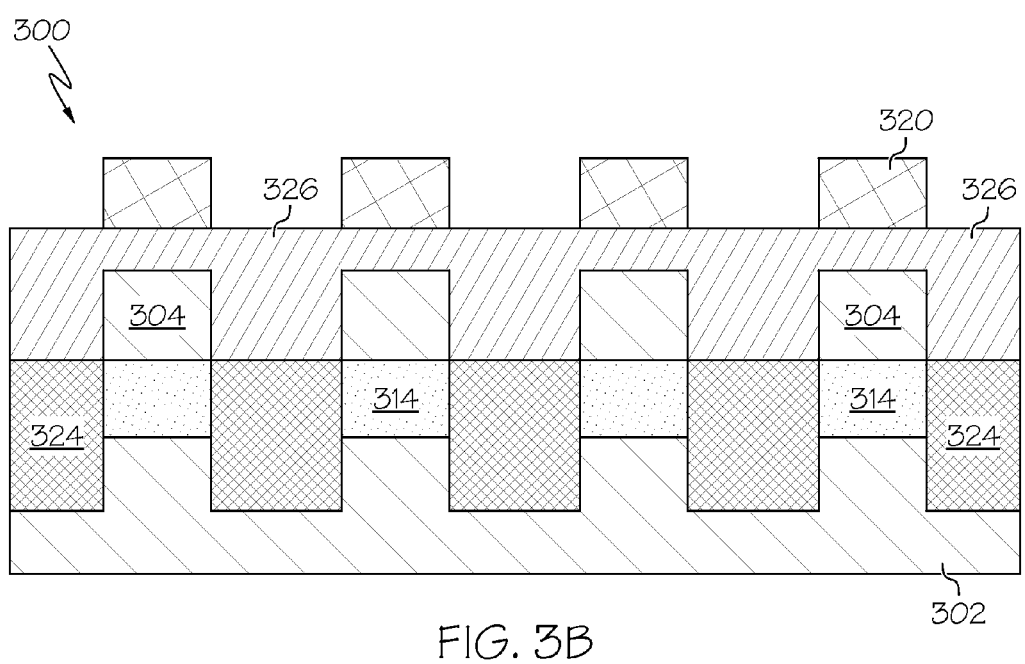
Figure 4A:
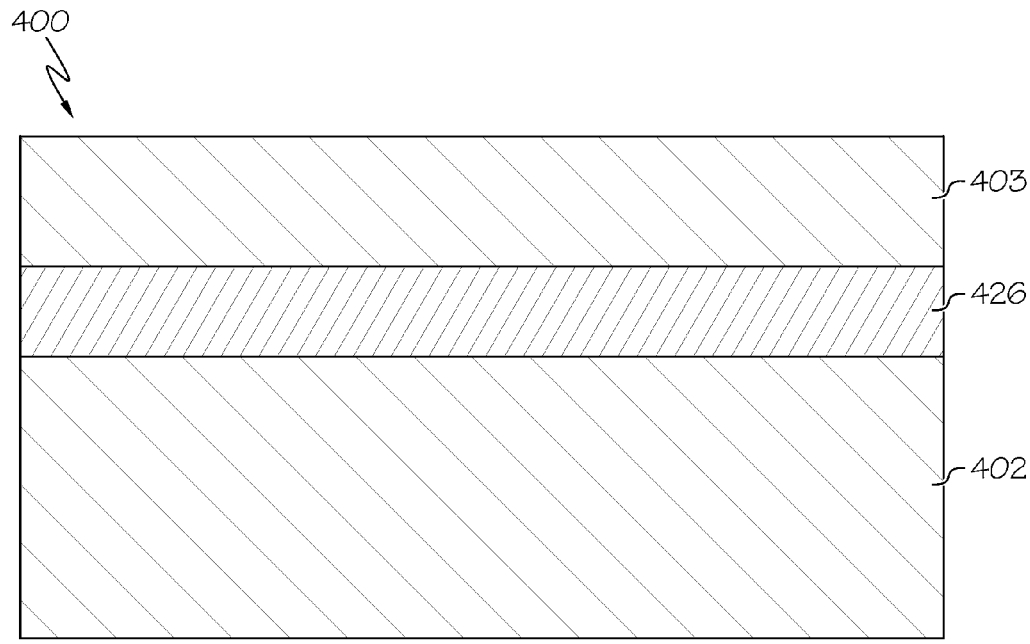
FIGS. 4(a)-4(g) show a cross-sectional view of processing steps for isolating source and drain regions of an integrated circuit (IC) device according to another illustrative embodiment.
Figure 4B:
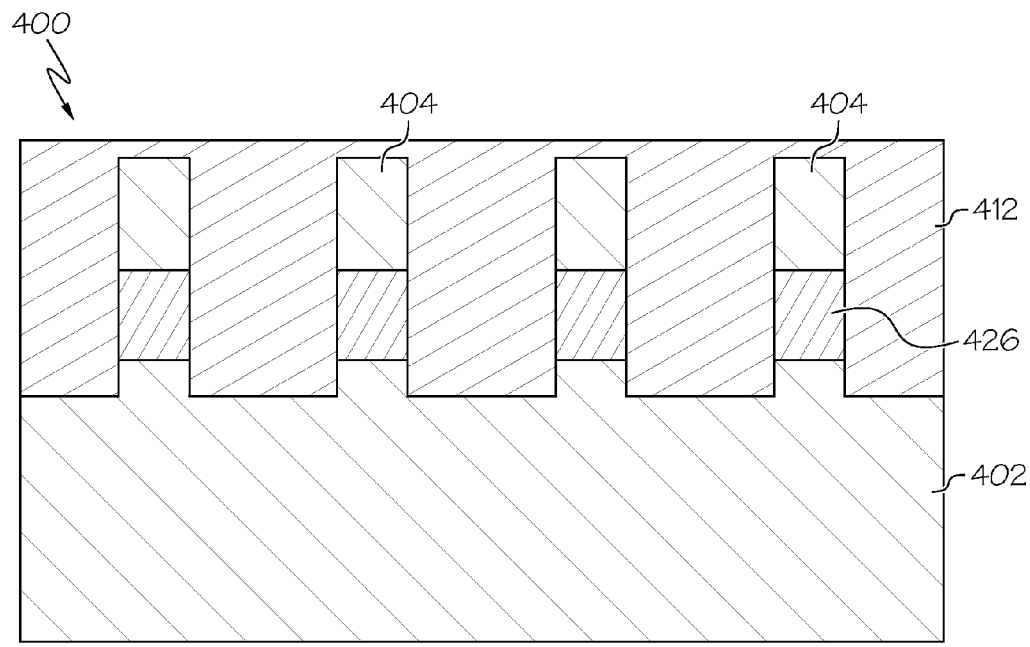
Figure 4C:
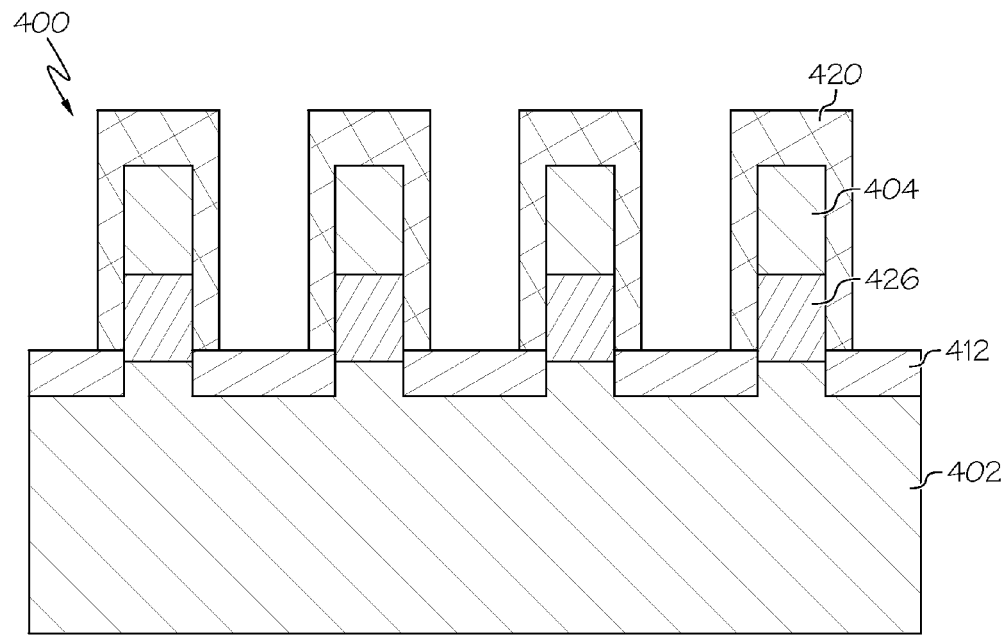
Figure 4D:
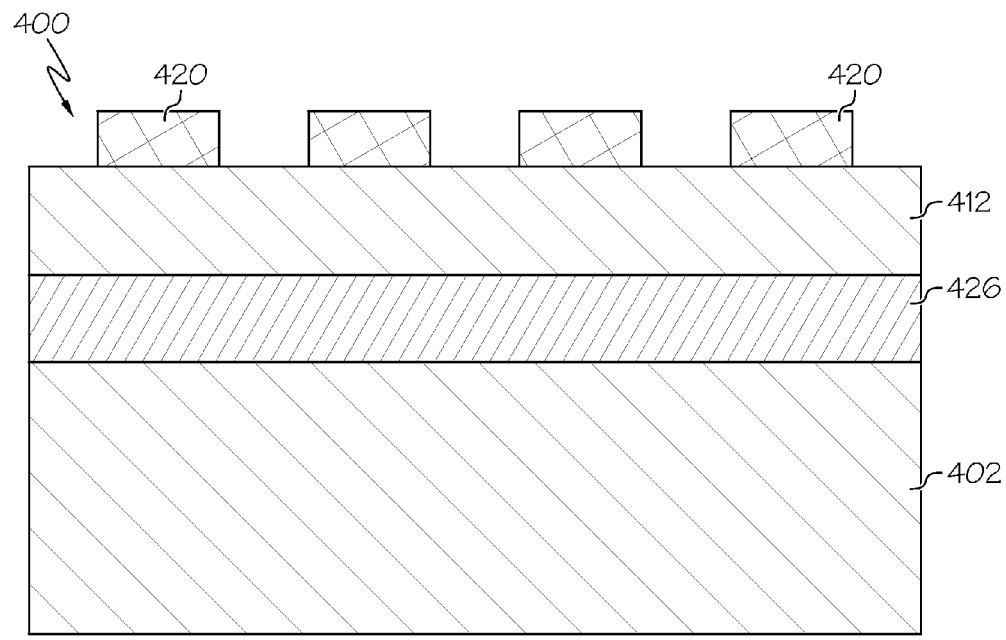
Figure 4E:
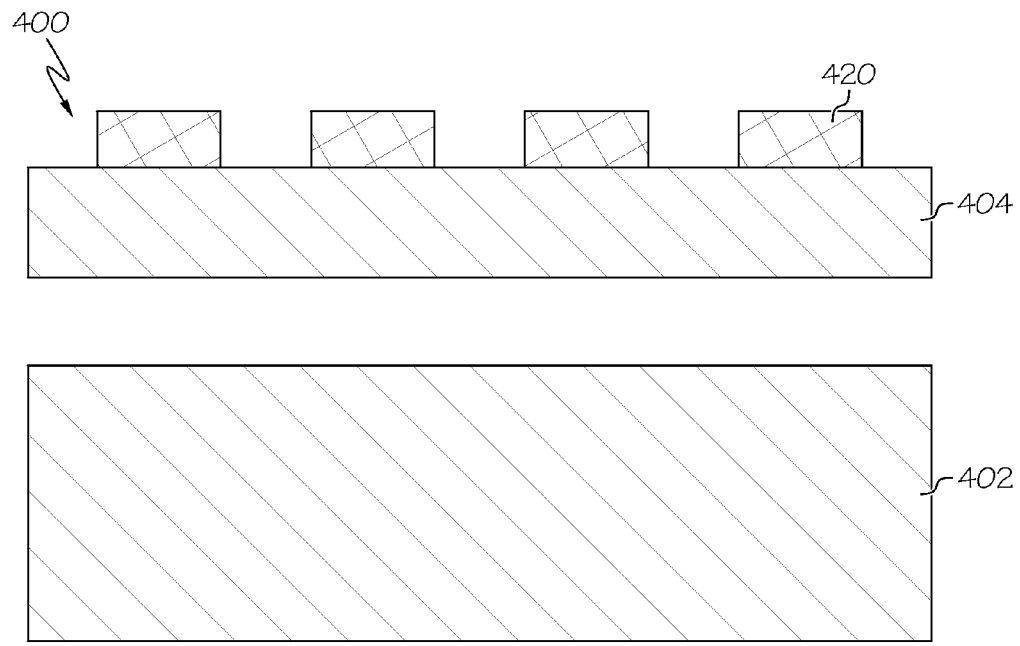
Figure 4F:
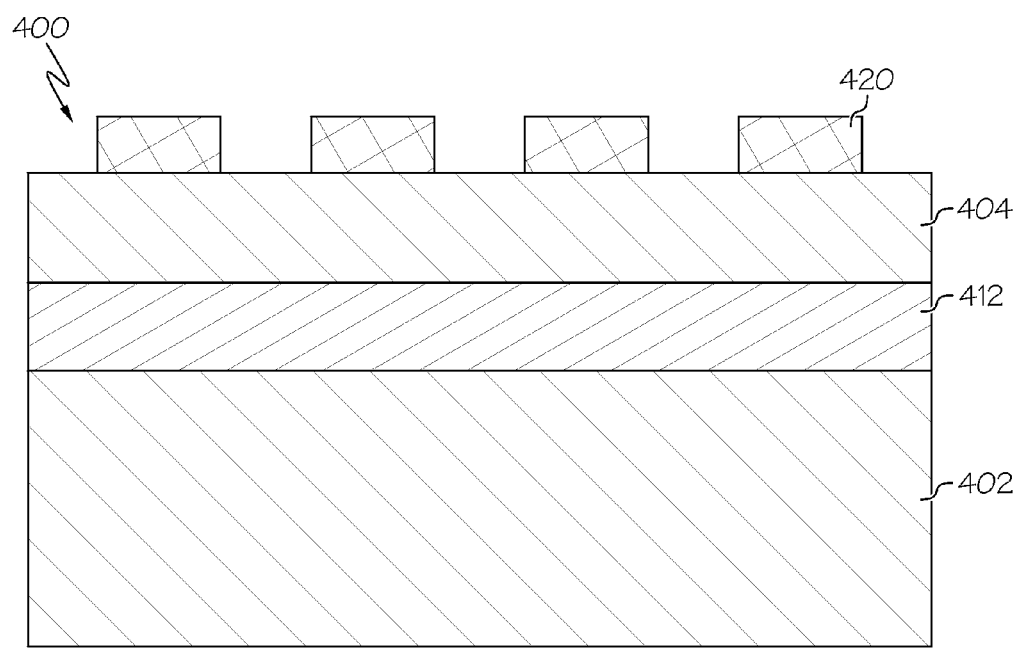
Figure 4G:
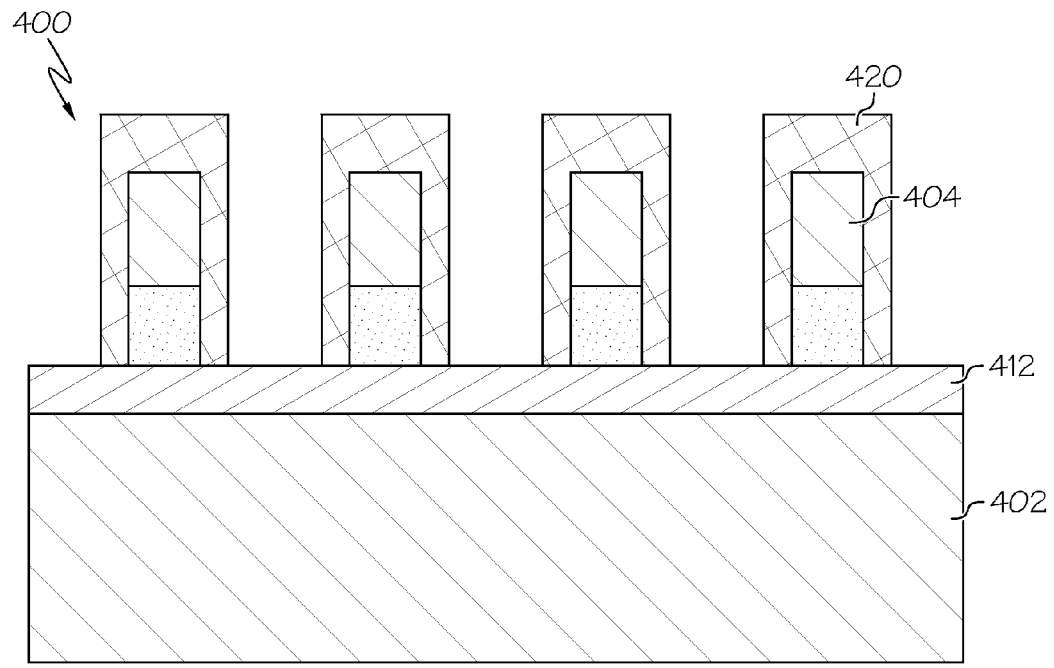

Referring now to FIGS. 3(a)-3(b), another embodiment for isolating S/D regions of FinFET device 300 will be shown and described. Although omitted for the sake of brevity, the processing steps shown in FIGS. 2(a)-2(i) may be similarly performed, followed by formation of epi bottom region 324 and embedded S/Ds 326, to achieve the structure of device 300. In this embodiment, device 300 comprises a gate structure 320 formed over fins 304 of a substrate 302, thermal isolation oxide 314 beneath an active fin channel (i.e., fin 304), and S/Ds 326 formed adjacent fins 304. As shown, epi bottom region 324 is present in a lower area of S/D 326, and comprises an epi that is counter doped via insitu doping. That is, epi bottom region 324 is grown with insitu-doped epi having an opposite polarity in a region proximate thermal isolation oxide 314, while boron-doped epi is grown in a region (e.g., S/D 326) close to each fin 304. In the case of e-SiGe, the epi in both regions may have the same Ge % concentration, but oppositely polarized dopants. In doing so, the growth of epi bottom region 324 should be above a bulk region of substrate 302; either it reaches a bottom surface of thermal isolation oxide 314, or it grows to fully cover thermal isolation oxide 314 and substantially connects with S/Ds 326, as shown in FIG. 3(a). In another embodiment, counter doped SiGe of epi bottom region 324 could employ carbon doping to avoid boron diffusion.

As shown in FIG. 3(b), an optional EPI merge and polish may then be performed for device 300. As described above, an epitaxial film of the material of S/D 326 (e.g., SiGe) is grown on each fin 304 to form the larger epi-merged layer. By doing so, a relatively uncontrollable EPI growth can be performed and then simply polished back. Furthermore, the EPI merge eases contact self-alignment during integration, and creates a larger surface area for contacts, thus potentially reducing contact resistance.

Using the approach shown in FIGS. 3(a)-3(b), additional stress is provided on the channel silicon, while also alleviating any leakage through S/D 326 or, vice versa, through the bulk silicon of substrate 302. Furthermore, this approach is relatively simple, as both counter doping of epi bottom region 324 and embedded S/D 326 is done insitu, i.e., no implantation is required.

Referring now to FIGS. 4(a)-4(g), another approach for isolating source and drain regions of a FinFET device 400 will be shown and described. In this embodiment, epi SiGe layer 426 is formed over the bulk silicon of substrate 402, and another silicon layer 403 is formed over epi SiGe layer 426, as shown in the cross section along the long axis of the FIN of FIG. 4(a). A set of fins 404 is then patterned, and STI material 412 is deposited and planarized, as shown in cross section along the short axis of the FIN (width of the FIN) of FIG. 4(b).

Next, STI material 412 is recessed to expose and prepare each fin 404 for gate formation. Specifically, a spacer 420 is formed over each fin 404, as shown in the cross section along the short axis of the FIN (width of the FIN) of FIG. 4(c), and the cross-section along the fins (i.e., cross section along the long axis of the FIN of FIG. 4(d). Next, a selective etch of SiGe layer 426 from under the active fin channel region (i.e., fin 404) is performed, as shown in the cross section along the long axis of the FIN of FIG. 4(e). In this embodiment, SiGe layer 426 is removed between substrate 402 and fin 404, and filled with thermal isolation oxide 414, as shown in the cross section along the long axis of the FIN of FIG. 4(f). The active fin channel region is then recessed, as shown in the cross section along the short axis of the FIN (width of the FIN) of FIG. 4(g), to prepare the fins 404 for gate formation. Although not shown for the sake of brevity, the processing steps of the various embodiments shown in FIGS. 2(i)-3(b) may then be similarly performed to achieve the structures of devices 200 and 300, respectively.

Figure 5A:
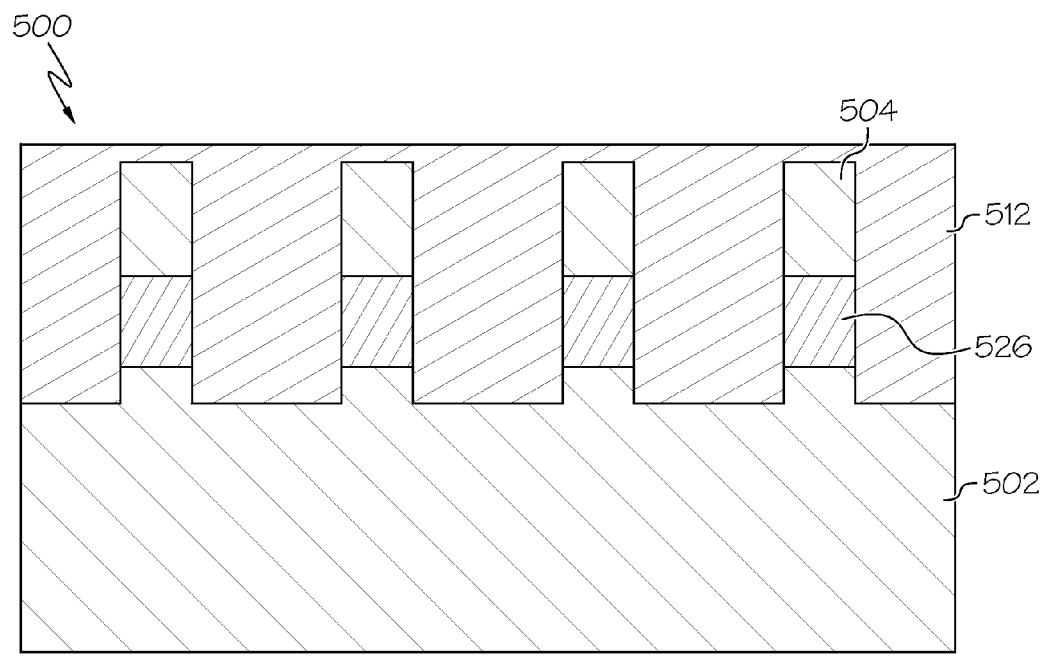
FIGS. 5(a)-5(e) show a cross-sectional view of processing steps for isolating source and drain regions of an integrated circuit (IC) device according to another illustrative embodiment.
Figure 5B:
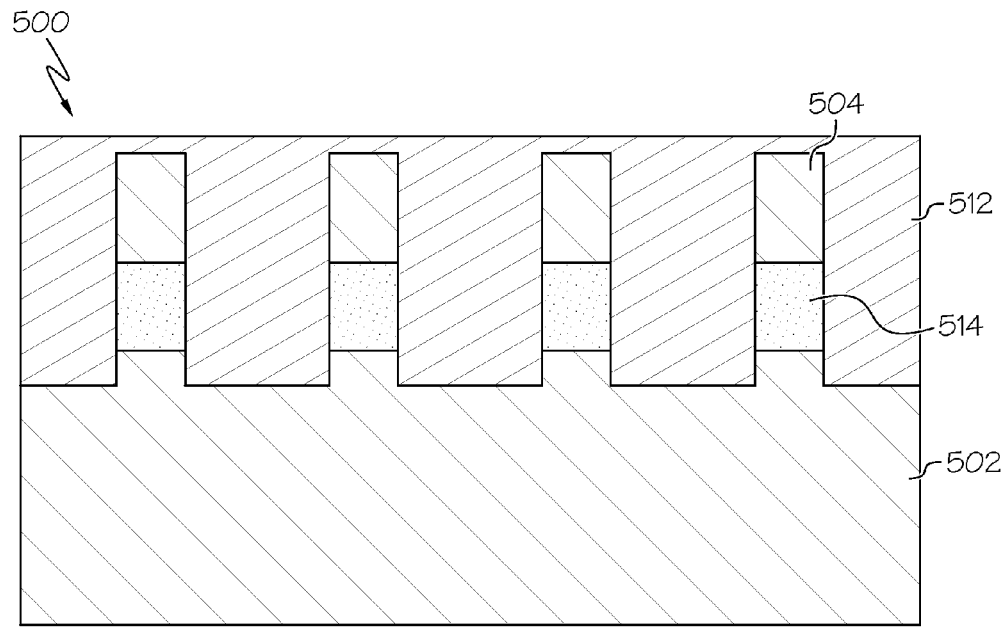

Referring now to FIGS. 5(a)-5(d), another approach for isolating source and drain regions of a FinFET device 500 will be shown and described. In this embodiment, epi SiGe layer 526 is formed over the bulk silicon of substrate 502, and another silicon layer is formed over epi SiGe layer 526 to form a set of fins 504, as shown in the cross section along the short axis of the FIN (width of the FIN) of FIG. 5(a). STI material 512 is deposited and planarized, as also shown. Next, an STI thermal anneal is performed to form thermal isolation oxide 514 at the SiGe epi bottom region, as shown in FIG. 5(b). In this embodiment, SiGe layer 526 (FIG. 5(a)) is exposed to oxygen, nitrous oxide, nitric oxide, or steam in a wet/dry environment at a temperature in the range of approximately 700 to 1000 degrees Celsius for the purposes of forming thermal isolation oxide 514.

Figure 5C:
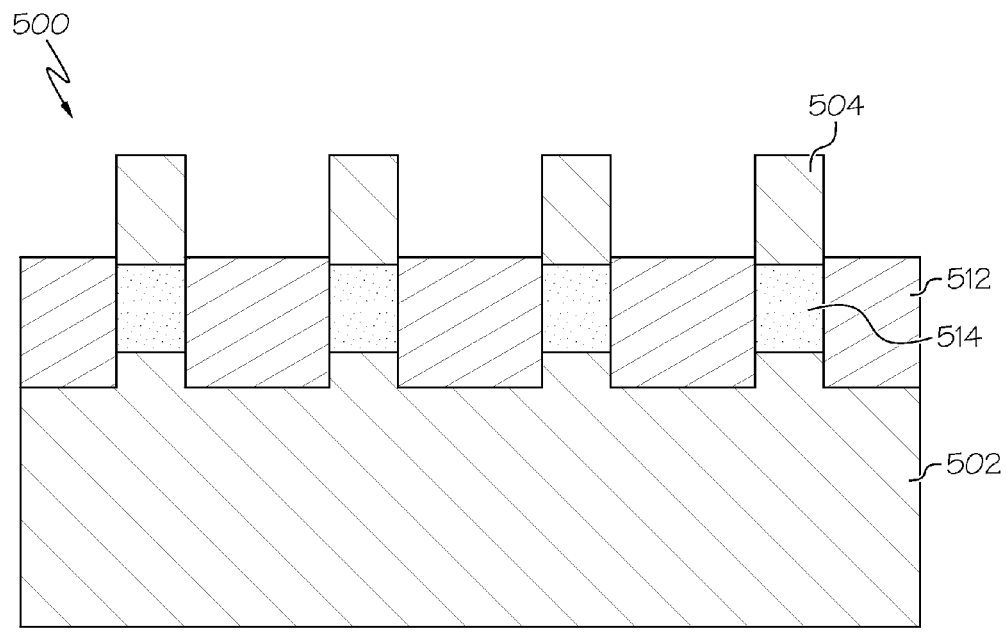
Figure 5D:
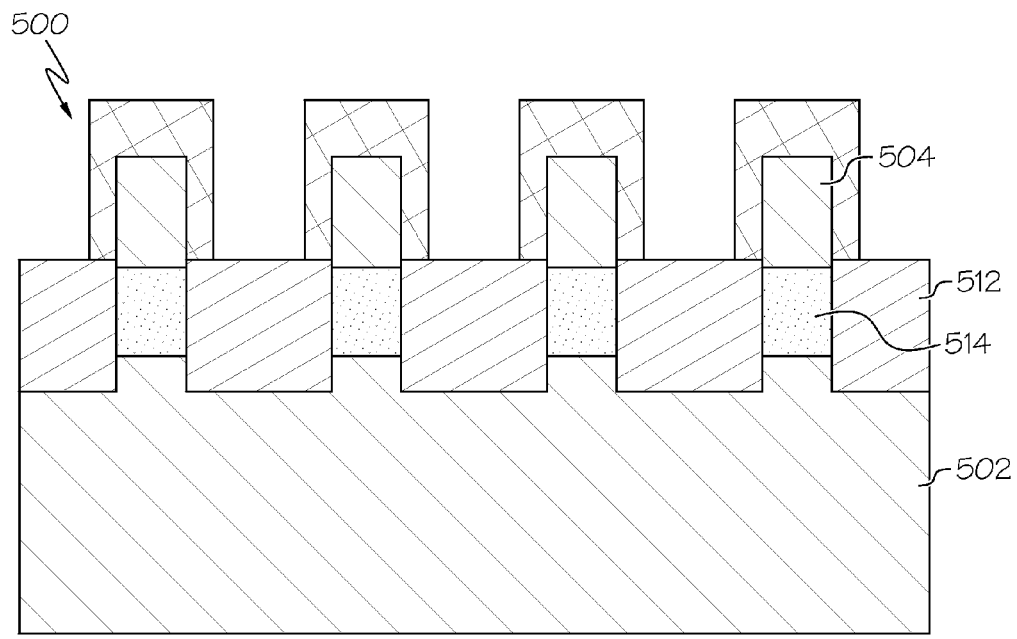
Figure 5E:
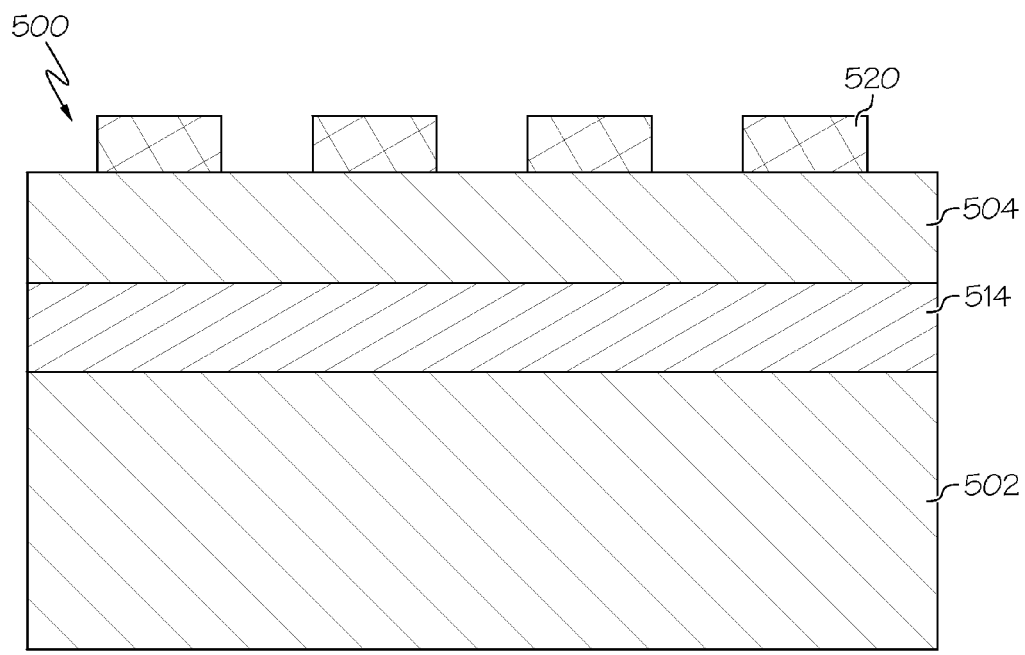

As shown in FIG. 5(c), STI material 512 is then recessed to a top surface of thermal isolation oxide 514, and a spacer 520 is formed over each fin 504, as shown in the cross section along the gate of FIG. 5(d), and the cross-section along the long axis of the FIN of FIG. 5(e).

Next, although not shown for the sake of brevity, the processing steps of the various embodiments shown in FIGS.

2(i)-3(b) may then be similarly performed to achieve the structures of devices 200 and 300, respectively.

Furthermore, in various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided device isolation in a complimentary metal-oxide fin field effect transistor. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A device comprising:
    a gate structure formed over a finned substrate;
    an embedded source and a drain (S/D) adjacent the gate structure and adjacent a fin of the finned substrate; and
    an epitaxial (epi) bottom region of the embedded S/D, the epi bottom region counter doped to a polarity of the embedded S/D.

2. The device of claim 1, wherein the epi bottom region comprises an implanted region beneath an upper portion of the epi bottom region, wherein the implanted region is doped and the upper portion of the epi bottom region is undoped.

3. The device of claim 2, wherein the embedded S/D is doped.

4. The device of claim 3, the embedded S/D comprising P++ doped Silicon Germanium (SiGe) for a p-channel metal-oxide-semiconductor field-effect transistor and N++ Silicon Carbon (SiC) for a n-channel metal-oxide-semiconductor field-effect transistor.

5. The device according to claim 1, further comprising an isolation oxide beneath an active fin channel of the gate structure.

6. The device according to claim 1, the embedded S/D comprising embedded SiGe.

7. A fin field effect transistor (FinFET) device having isolated source and drain regions, the FinFET device comprising:
    a gate structure formed over a finned substrate;
    an isolation oxide beneath an active fin channel of the gate structure;
    an embedded source and a drain (S/D) formed adjacent the gate structure and the isolation oxide; and
    an epitaxial (epi) bottom region of the embedded S/D, the epi bottom region counter doped to a polarity of the embedded S/D.

8. The FinFET device of claim 7, wherein the epi bottom region comprises an implanted region beneath an upper portion of the epi bottom region, wherein the implanted region is doped and the upper portion of the epi bottom region is undoped.

9. The FinFET device of claim 8, wherein the embedded S/D is doped.

10. The device of claim 9, the embedded S/D comprising P++ doped Silicon Germanium (SiGe) for a p-channel metal-oxide-semiconductor field-effect transistor and N++ Silicon carbon (SiC) for a n-channel metal-oxide-semiconductor field-effect transistor.

11. The device according to claim 7, the embedded S/D comprising embedded SiGe.

12. A method for isolating source and drain regions of a fin field effect transistor (FinFET) device, the method comprising:
    forming a gate structure over a finned substrate;
    providing an isolation oxide beneath an active fin channel of the gate structure;
    forming an embedded source and a drain (S/D) adjacent the gate structure and the isolation oxide; and
    forming an epitaxial (epi) bottom region of the embedded S/D, the epi bottom region counter doped to a polarity of the embedded S/D.

13. The method of claim 12, further comprising implanting a set of implanted regions beneath an upper portion of the epi bottom region, wherein the implanted region is doped and the upper portion of the epi bottom region is undoped.

14. The method of claim 13, further comprising doping the embedded S/D.

15. The method of claim 14, the embedded S/D comprising P++ doped Silicon Germanium (SiGe) for a p-channel metal-oxide-semiconductor field-effect transistor and N++ Silicon Nitride (SiN) for a n-channel metal-oxide-semiconductor field-effect transistor.

16. The method according to claim 12, the embedded S/D comprising embedded SiGe.

17. The method according to claim 12, further comprising:
    forming a set of fins from a bulk Si;
    depositing a shallow trench isolation (STI) material over the set of fins;

recessing the STI material to expose the set of fins; and
forming a spacer over each of the set of fins.

18. The method according to claim 17, further comprising performing a thermal oxidation to the FinFET device following deposition of the STI material over the set of fins.

19. The method according to claim 17, the forming the set of fins comprising:
   forming an epi SiGe layer over the bulk Si;
   forming an epi Si layer over the epi SiGe; and
   patterning a set of openings through the epi Si layer and the epi SiGe layer, and into the bulk silicon.

20. The method according to claim 17, the forming the set of fins from the substrate comprising:
   patterning a set of openings into the bulk Si;
   forming a SiN capping layer over each of the set of fins; and
   etching the bulk Si between each of the set of fins.

\* \* \* \* \*